United States Patent [19]
Zahurak et al.

[11] Patent Number: 6,090,655
[45] Date of Patent: Jul. 18, 2000

[54] INCREASED INTERIOR VOLUME FOR INTEGRATED MEMORY CELL

[75] Inventors: John K. Zahurak; Richard H. Lane, both of Boise, Id.

[73] Assignee: Micron Technology, Inc., Boise, Id.

[21] Appl. No.: 09/026,355

[22] Filed: Feb. 19, 1998

Related U.S. Application Data

[62] Division of application No. 08/643,887, May 7, 1996, Pat. No. 5,760,434.

[51] Int. Cl.⁷ .................................................. H01L 21/8242
[52] U.S. Cl. .......................... 438/239; 438/253; 438/255; 438/396; 438/398
[58] Field of Search ...................... 438/255, 396, 438/398, 656, 668, 683

[56] References Cited

U.S. PATENT DOCUMENTS

| | | | |
|---|---|---|---|
| 5,082,797 | 1/1992 | Chan et al. | 438/255 |
| 5,094,977 | 3/1992 | Yu et al. | 438/653 |
| 5,182,232 | 1/1993 | Chhabra et al. | 438/398 |
| 5,191,509 | 3/1993 | Wen | 361/311 |
| 5,231,056 | 7/1993 | Sandhu | 438/654 |
| 5,236,865 | 8/1993 | Sandhu et al. | 438/530 |
| 5,240,739 | 8/1993 | Doan et al. | 427/126.1 |
| 5,278,091 | 1/1994 | Fazan et al. | 438/398 |
| 5,278,100 | 1/1994 | Doan et al. | 438/681 |
| 5,286,663 | 2/1994 | Manning | 257/350 |
| 5,340,765 | 8/1994 | Dennison et al. | 438/398 |
| 5,344,792 | 9/1994 | Sandhu et al. | 438/660 |
| 5,376,405 | 12/1994 | Doan et al. | 427/126.1 |
| 5,396,093 | 3/1995 | Lu | 257/306 |
| 5,407,534 | 4/1995 | Thakur | 438/398 |
| 5,418,180 | 5/1995 | Brown | 438/398 |
| 5,494,841 | 2/1996 | Dennison et al. | 438/210 |
| 5,554,557 | 9/1996 | Koh | 438/396 |
| 5,563,090 | 10/1996 | Lee et al. | 438/398 |
| 5,612,558 | 3/1997 | Harshfield | 257/298 |
| 5,639,685 | 6/1997 | Zahurak et al. | 438/398 |
| 5,696,017 | 12/1997 | Ueno | 438/253 |
| 5,763,286 | 6/1998 | Figura et al. | 438/255 |
| 5,817,555 | 10/1998 | Cho | 438/253 |
| 5,866,455 | 2/1999 | Wu | 438/255 |

OTHER PUBLICATIONS

Lou, Y–S, et al., The Process Window of a–Si/Ti Bilayer Metallization for an Oxidation–Resistant and Self–Aligned TiSi, Process. *IEEE Transactions on Electronic Devices*, vol. 39, No. 8, Aug. 1993, pp. 1835–1843.

*Primary Examiner*—Michael Trinh
*Assistant Examiner*—Toniae M. Thomas
*Attorney, Agent, or Firm*—Knobbe, Martens, Olson & Bear, LLP

[57] ABSTRACT

Disclosed is a three-dimensional integrated memory cell having a high interior volume and a method for constructing the same. The cell makes use of a highly conductive substrate material for the bottom electrode, allowing construction of a thin substrate without intolerable resistance. The substrate of the preferred embodiment, for example, comprises titanium silicide. The preferred method comprises conformal deposition of a thin polysilicon layer within a high aspect ratio container, followed by deposition of a suitable metal for silicidation with the polysilicon layer. The metal need not be conformal for this preferred method and may be deposited by sputter deposition. After silicidation, excess metal is selectively etched away to leave a conformal, thin yet highly conductive substrate material. The greater volume available due to this thinner substrate permits either scaling down of the cell dimension for more dense arrays with maintained capacitance per memory cell, or use of larger microstructures over the bottom electrode substrate, such as hemispherical grained silicon layers, for increased electrode surface area and greater capacitance.

25 Claims, 11 Drawing Sheets

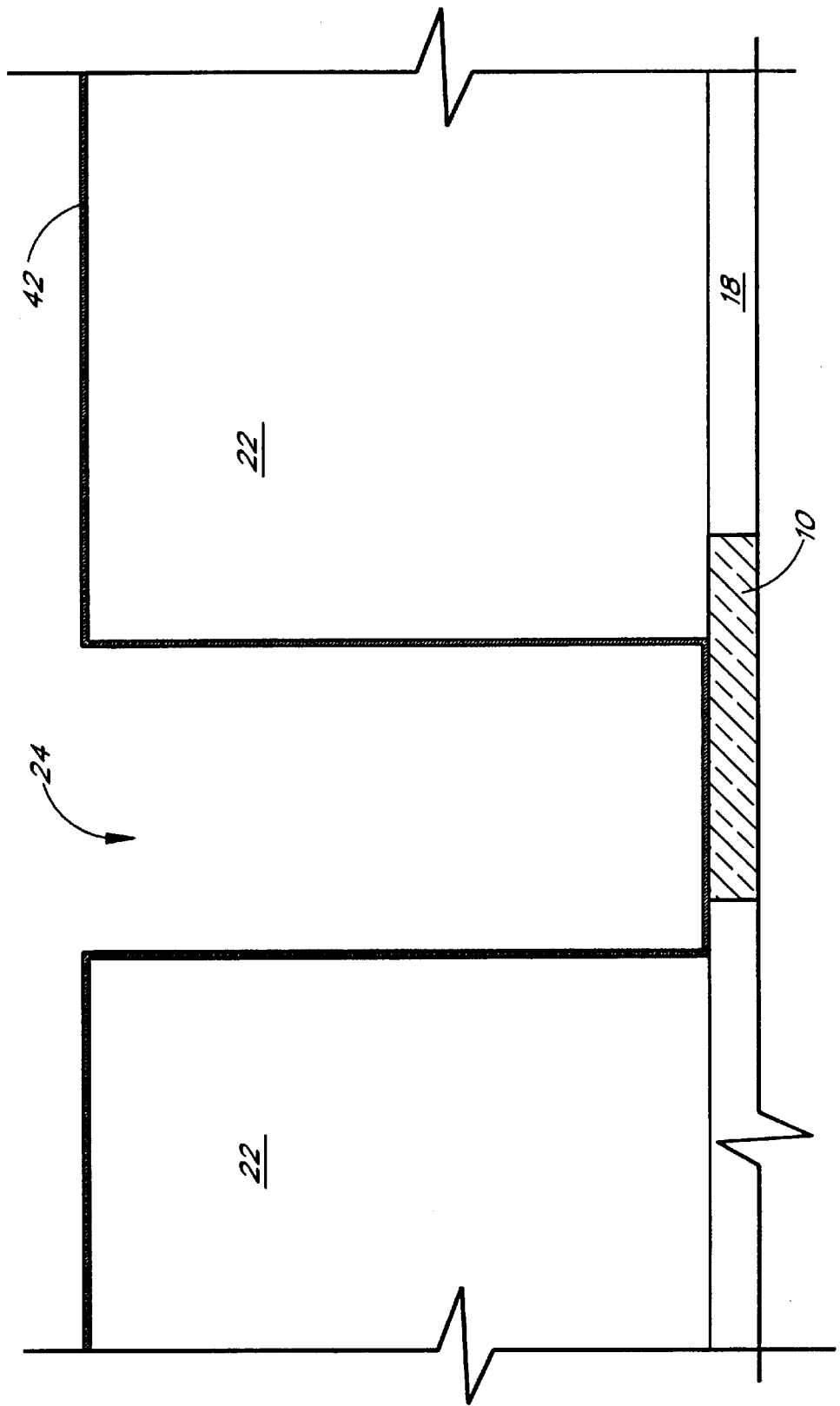

INCREASED INTERIOR VOLUME FOR INTEGRATED MEMORY CELL

REFERENCE TO RELATED APPLICATION

The present application is a divisional of U.S. patent application No. 08/643,887, filed May 7, 1996, now issued as U.S. Pat. No. 5,760,434 on Jun. 2, 1998.

FIELD OF THE INVENTION

The present invention relates to integrated circuit memory cells, and more particularly to three-dimensional folding capacitor structures for dense memory arrays.

BACKGROUND OF THE INVENTION

Recent advances in the miniaturization of integrated circuits have led to smaller wafer areas made available for devices. High density dynamic random access memory chips (DRAMs), for example, leave little room for the storage node of a memory cell. Yet even as the "footprint" (area of a silicon wafer allotted Individual memory cells) shrinks, the storage node (capacitor) must maintain a certain minimum charge storage capacity, determined by design and operational parameters, to ensure reliable operation of the memory cell. It is thus increasingly important that capacitors achieve a high stored charge storage per unit area of the wafer. Accordingly, several techniques have been recently developed to increase the total charge capacity of the cell capacitor without significantly affecting the wafer area occupied by the cell.

Traditionally, capacitors integrated into memory cells have been patterned after the parallel plate capacitor. An interelectrode dielectric material is deposited between two conductive layers, which form the capacitor plates or electrodes. The amount of charge stored on the capacitor is proportional to the capacitance, $C=\epsilon\epsilon_0 A/d$, where $\epsilon$ is the dielectric constant of the capacitor dielectric, $\epsilon_0$ is the vacuum permittivity, A is the electrode area, and d represents the spacing between electrodes. Some techniques for increasing capacitance include the use of new materials characterized by high dielectric constants.

Other techniques concentrate on increasing the effective surface area ("A") of the electrodes by creating folding structures such as trench or stacked capacitors. Such structures better utilize the available chip area by creating three dimensional shapes to which the conductive plates and capacitor dielectric conform. For example, U.S. Pat. No. 5,340,765, issued Aug. 23, 1994 to Dennison et al. and assigned to the assignee of the present invention, discloses a process for forming a capacitor structure resembling a cylindrical container. More complex structures, such as the container-within-container and multiple pin structures disclosed in U.S. Pat. No. 5,340,763, issued Aug. 23, 1994 to Dennison, may further increase electrode surface area and allow the extension of conventional fabrication materials to future generation memory devices.

FIGS. 1–3 illustrate the fabrication of a simple container in the context of a dynamic random access memory (DRAM) cell. FIG. 1 illustrates a partially fabricated memory cell within an integrated circuit, representing a starting point for the preferred embodiments of the present invention. A conductive plug 10 between neighboring word lines 12, usually comprising polysilicon, forms electrical contact with an active area 14 of a semiconductor substrate 16, such as a silicon wafer. A planarized insulating layer 18, generally an oxide in the form of borophosphosilicate glass (BPSG), surrounds the word lines 12, the plug 10 is formed within an opening through the insulating layer 18, and a structural layer 22 overlies the insulating layer 18 in turn. The structural layer 22 may also comprise a layer of BPSG. A container 24 is then opened within the structural layer 22, thereby exposing the conductive plug 10.

The container 24 is generally etched anisotropically through a mask, resulting in a cylindrical container 24 with vertical sidewalls, in accordance with conventional integrated circuit contact formation. (FIG. 1 is a schematic cross-section which does not show the back wall of the container. In reality, the container resembles a three-dimensional cylinder.) As dimensions continue to be scaled below the submicron level, the container shrinks in the horizontal dimension. The height of the container, however, should at least remain constant. More likely, the container height must be increased in order to maintain the capacitance of previous-generation memory cells. In other words, the aspect ratio of containers increases as circuitry becomes more densely packed. The illustrated container 24 is thus characterized by a diameter of between about 5,000 Å and 6,000 Å (0.5–0.6 micron), a depth of about 10,000 Å, and thus an aspect ratio greater than 1.0. These dimensions are typical of 4 Mbit to 64 Mbit DRAM arrays. Note that FIG. 1 and the drawings to follow are not drawn to scale.

Referring now to FIG. 2, a conductive layer 26 is then deposited over the structural layer 22. The conductive layer 26, which lines the inside surfaces of the container 24 and includes horizontal portions 27 overlying the unetched structural layer 22, forms the structural basis for the capacitor bottom electrode to be further defined in later process steps. The conductive layer 26 conventionally takes the form of a polysilicon layer 26 due to advantages in deposition of polysilicon. While sputtered metals may demonstrate greater conductivity than polysilicon, they cannot provide conformal coverage of the container 24, especially where the aspect ratio is greater than about 1.0. Non-conformal metal coverage results in unsatisfactory container structures, particularly due to high resistivity at thin portions. Additionally, sputtered metal builds very quickly at the lip of the container, leaving little room for later-deposited layers such as the capacitor dielectric and the top electrode layers, and may even lead to closure of the container mouth and keyhole formation. With increasing densities of integrated circuitry, it has become vitally important that capacitor electrode layers have uniform thickness to ensure reliable memory cell operation.

The polysilicon layer 26, on the other hand, may be deposited by low pressure chemical vapor deposition (LPCVD), resulting in controlled, conformal coverage of the container 24 surfaces. The polysilicon 26 should be doped to lower access resistance and decrease the charge depletion width in the bottom plate, thus increasing capacitance and access speed. For example, the polysilicon 26 may be diffusively doped with phosphorus from solid source $P_2O_5$, it may be doped with implanted dopants, or in-situ doped by flowing phosphine gas along with the silicon source gas (e.g., silane) during chemical vapor deposition of the polysilicon layer 26. Heavily doping the polysilicon 26, however, increases polysilicon deposition time. Nevertheless, due to advantages in achieving uniformly thick layers, polysilicon remains the standard material for folding electrode structures.

Referring now to FIG. 3, the horizontal portions 27 of the polysilicon layer 26 have been removed by a planarization step, such as chemical mechanical planarization (CMP), for isolation of the various memory cells in the array. A polysilicon container 28, which is to serve as a bottom electrode for the cell capacitor, is left in contact with the polysilicon plug 10. An inside surface 30 of the container 28 is available for charge storage during circuit operation. For other known process flows, the outside surface may also contribute to capacitance by removal of the structural layer. The capacitor dielectric and top electrode may then be successively deposited.

As shown in FIG. 4, electrode surface area may also be increased by providing a high surface area microstructure for the electrode surface. One class of methods for providing a microstructure for electrode surfaces involves texturizing a conductive layer by formation of hemispherical grained (HSG) silicon. HSG silicon may be formed by various methods known in the art, including low pressure CVD (LPCVD) and silicon deposition followed by vacuum anneal under specified temperature and pressure conditions. The container 24 of FIG. 1 is lined with a polysilicon layer 35, similar to the polysilicon 26 of FIG. 2, and an HSG silicon layer 36 is formed over the polysilicon layer 35. A planarization step may be performed after the HSG silicon layer 36 has been formed, for electrical isolation of the memory cells in an array, leaving a container similar to that of FIG. 3 but with a textured interior surface. The cell dielectric and top electrode would then be deposited conformally thereupon.

HSG silicon may increase the electrode surface area of any capacitor configuration, and may also be formed after planarization, for example, or after removal of the structural layer for process flows designed to expose the outside surfaces of the container as well. Generally, however, the rough surface is formed prior to the isolation step, as illustrated, thus avoiding additional isolation etch steps following HSG formation.

As apparent from FIG. 4, the bottom electrode surface follows the contours of individual hemispherical grains 37 of the HSG silicon 36 protruding between 300 Å and 600 Å above the polysilicon layer 35, providing a considerably greater surface for the bottom electrode than the smooth polysilicon layer 35 alone. Formation of taller grains 37, or increased "bump height," would tend to even further increase electrode surface area and cell capacitance. Hence, it would be advantageous to employ a thicker layer of HSG silicon.

At the same time, however, the limited volume within the container 34 puts severe constraints on the thickness of layers lining the container 34. The polysilicon layer 35 underlying the HSG silicon 36 serves as a conductive substrate, required to ensure electrical connection of individual hemispherical grains 37. Typically, the thickness of the polysilicon layer 35 is between about 500 Å and 1,000 Å, occupying a substantial volume of the memory cell which may otherwise have been available for taller HSG silicon grains 37.

Moreover, as the packing density for DRAM arrays increases and cell dimensions are scaled down further, the polysilicon substrate below HSG silicon layers must still maintain low access resistance by maintaining thicknesses of over 300 Å. Accordingly, with current fabrication processes, bump height of the HSG silicon layer 36 must be lowered to make room for the cell dielectric and top electrode. As a result, DRAM cells of current and future generations cannot take full advantage of potential further increases in surface area from thicker HSG silicon layers. In other words, cell capacitance is limited by a lack of interior volume within the cell.

A need therefore exists to increase the interior volume available within a memory cell capacitor structure of a given outside diameter.

SUMMARY OF THE INVENTION

A method is disclosed for fabricating a bottom electrode for a DRAM cell capacitor. In accordance with one aspect of the invention, the method comprises forming a container in a structural layer overlying a semiconductor substrate. The container is then lined with a thin metal-containing conductive substrate. Thereafter, a layer of hemispherical grained silicon (HSG) is grown over the substrate.

In accordance with a disclosed preferred embodiment, the step of forming the substrate within the container comprises low pressure chemical vapor deposition of a thin polysilicon layer, followed by a metal layer (such as titanium). The metal layer and polysilicon layer are then reacted in a high temperature step, and excess metal is etched away, leaving a silicide substrate (such as titanium silicide).

The bottom electrode thus comprises a thin metal-containing substrate under an HSG silicon layer. For the preferred embodiment, the substrate comprises a metal silicide layer of uniform thickness.

BRIEF DESCRIPTION OF THE DRAWINGS

FIGS. 5–11 illustrate generally a method of fabricating a memory cell capacitor, in accordance with a preferred embodiment of the present invention.

DETAILED DESCRIPTION OF THE PREFERRED EMBODIMENT

The present invention provides a memory cell having a high interior volume and a method for constructing the same. The preferred embodiments are described in the context of a dynamic random access memory (DRAM) cell, the bottom electrode of which takes the form of a container structure with a hemispherical grained (HSG) polysilicon interior surface. Those having skill in the art, however, will find application for the present invention in other contexts. For example, the invention may be applied to other capacitor designs for which greater interior volume is desired. Additionally, the area of interior and exterior surfaces of the bottom electrode may be enhanced by microstructures other than HSG silicon.

Figure 1:
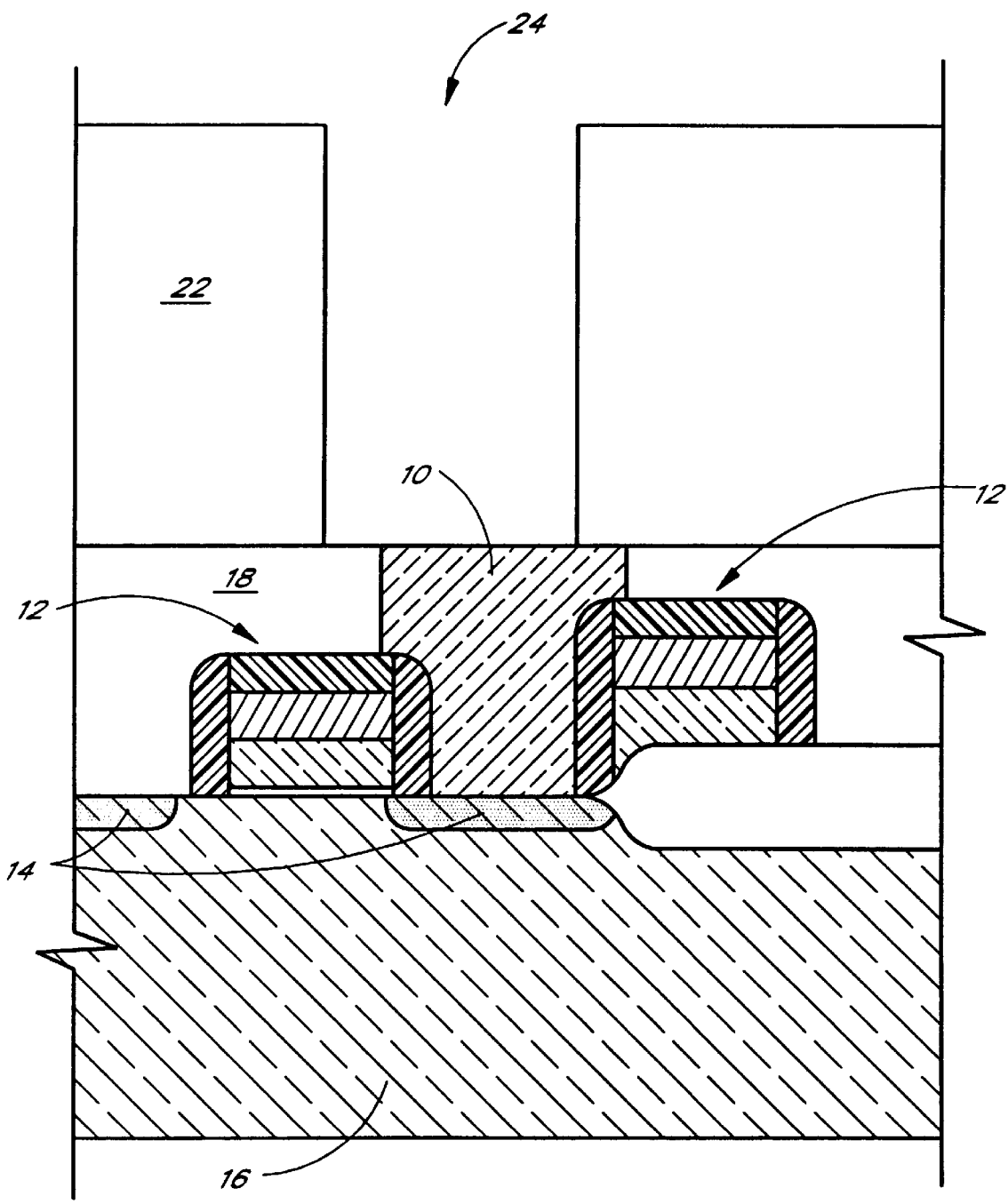
FIGS. 1–3 illustrate generally the fabrication of a conductive container for use as the bottom electrode of an integrated memory cell, utilizing polysilicon in accordance with a conventional technique.
Figure 2:
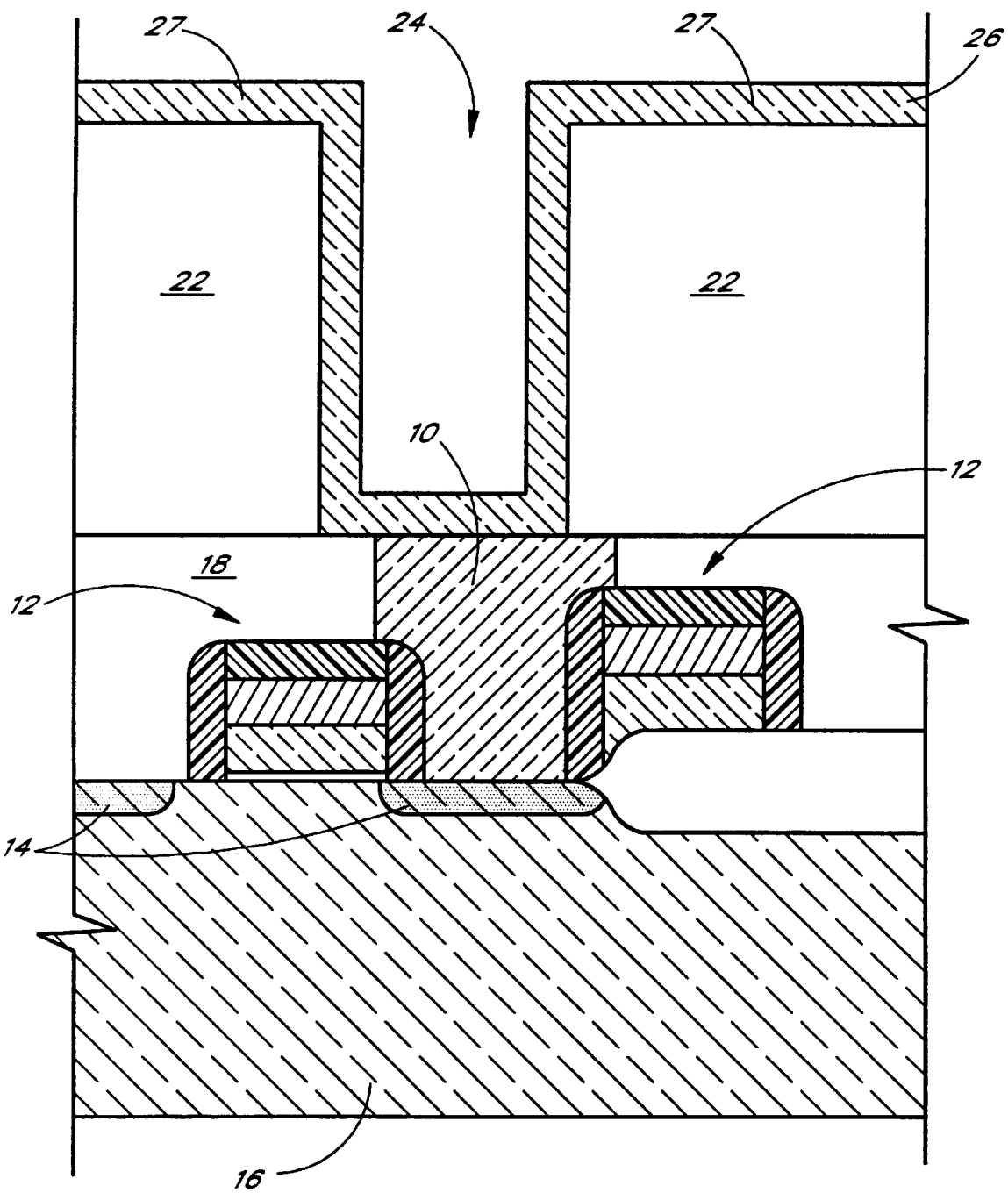

Prior art FIG. 1 may serve as a starting point for the method of the preferred embodiment of the present invention. As described in the "Background" section above, a container 24 has been etched through a structural layer 22, most preferably comprising borophosphosilicate glass (BPSG). The etch stops at a polysilicon plug 10, which extends through an insulating layer 18 (also preferably comprising BPSG) to form electrical contact with a device active area 14. In accordance with the preferred embodiment, the container 24 is characterized by a diameter between about 3,000 Å and 10,000 Å, preferably less than about 9,000 Å, and most preferably about 5,000 Å. This dimension is determined by balancing competing considerations of maximizing cell width while minimizing risk of shorting between electrodes of adjacent memory cells for any DRAM array. The depth of the container 24 is between about 5,000 Å and 15,000 Å, and most preferably about 10,000 Å.

Figure 4:
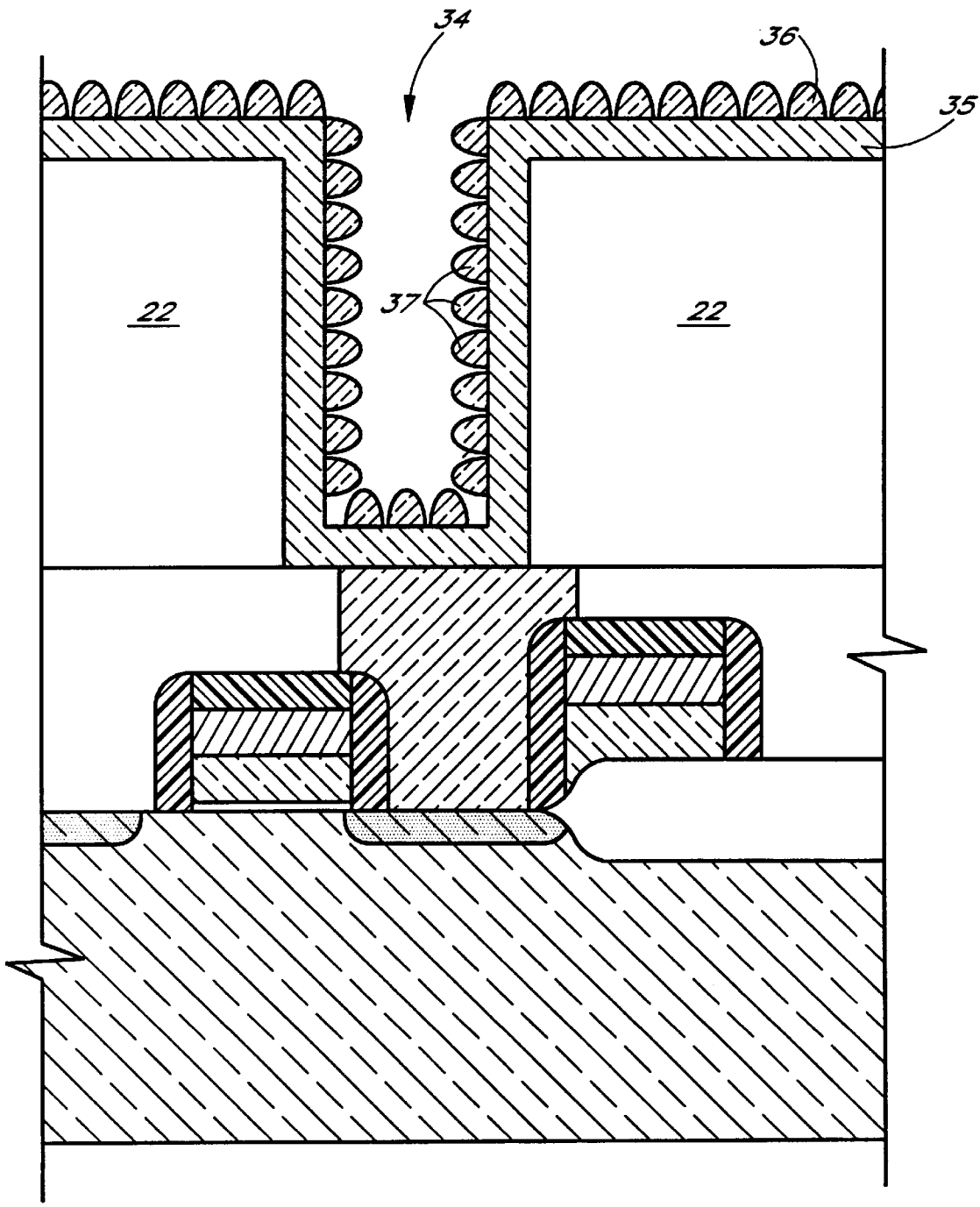
FIG. 4 illustrates a stage in the fabrication of a conductive container, utilizing polysilicon in accordance with a conventional technique, lined with hemispherical grained (HSG) silicon.

FIGS. 5–8 illustrate generally the formation of a conformal conductive substrate layer 60 (see FIG. 8), preferably of substantially uniform thickness, over which a surface-enhancing microstructure may be constructed, in accordance with the preferred embodiment. The conductive substrate 60 of the preferred embodiment comprises a material which is highly conductive, as compared to the polysilicon layer 35 (FIG. 4) of the prior art. Highly doped polysilicon (e.g., 300 Å thick) generally demonstrates resistivity of about 3,000 $\mu\Omega$-cm. Due to lower intrinsic resistivity, the substrate 60 may be thinner than the polysilicon layer 35 while maintaining similar overall access resistance. While many metals may provide suitable conductivity for this purpose, conformal coverage of the high aspect ratio containers with sputtered metal is near impossible.

Therefore, the substrate 60 of the preferred embodiment comprises a metal silicide or a polycide (composite polysilicon and silicide layer). Since metal silicides demonstrate resistivities between about 10 $\mu\Omega$-cm and 100 $\mu\Omega$-cm, the preferred substrate 60 may be exceedingly thin while still demonstrating conductivity better than a polysilicon layer of 500 Å. For example, molybdenum silicide may demonstrate resistivities of about 100 $\mu\Omega$-cm, tungsten silicides between about 30 $\mu\Omega$-cm and 70 $\mu\Omega$-cm, and titanium silicide as low as 13 $\mu\Omega$-cm to 25 $\mu\Omega$-cm. It will be understood that silicide resistivities may vary within or slightly outside of these ranges, depending upon deposition processes and anneal conditions used. In any case, silicide resistivity will be well below that of doped polysilicon, allowing use of conductive substrates less hand 300 Å thick.

Recently, CVD methods have been developed to directly deposit suicides into high aspect ratio containers. Various CVD methods for titanium silicide, for example, have been described in U.S. Pat. No. 5,240,739, No. 5,278,100, No. 5,376,405, all issued to Doan et al., and U.S. Pat. No. 5,344,792, issued to Sandhu et al. The disclosure of each of the foregoing patents are hereby incorporated by reference. These references generally describe low pressure CVD (LPCVD) methods for depositing silicides, and particularly titanium silicide, which may be incorporated into the present invention. For example, a process incorporating silane ($SiH_4$) as the silicon source may be performed with titanium tetrachloride ($TiCl_4$) as the titanium source.

Most preferably, however, the silicide is formed by reacting a silicon source layer with a metal source layer. Forming silicide through thermal reaction between metal and silicon layers is advantageous in that only the polysilicon deposition needs to be carefully controlled, as will be understood from the description below.

FIG. 5 is an enlarged view of the container 24 of FIG. 1 following a polysilicon deposition step. The deposition preferably comprises a CVD, and most preferably a low pressure CVD process flowing silane or disilane as silicon source gases. LPCVD for polysilicon layers is well-understood in the art of integrated circuit fabrication, and the thickness of a resultant polysilicon layer 42 may be precisely controlled. Preferably, the temperature during deposition should be maintained between about 500° C. and 700° C., most preferably at about 620° C., and reactor pressure should be between about 100 mTorr and 1,000 mTorr, most preferably about 500 mTorr. As will be understood by the skilled artisan, gas flow rate and deposition time may be varied to produce a preferred thickness of the polysilicon layer 42 between about 50 Å and 500 Å, and most preferably about 100 Å.

Figure 6A:
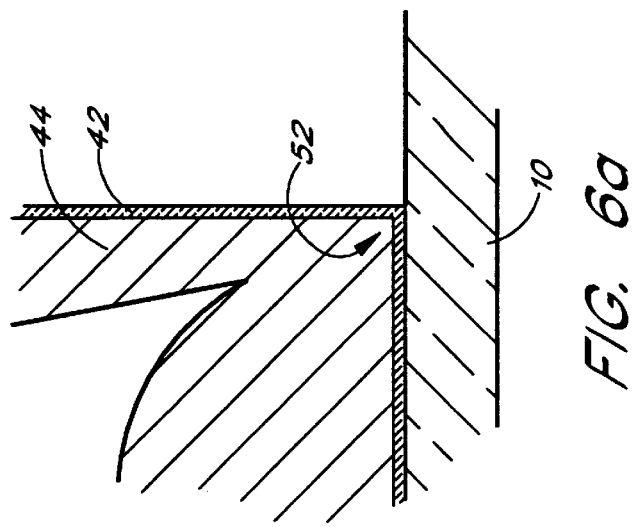
Figure 6:
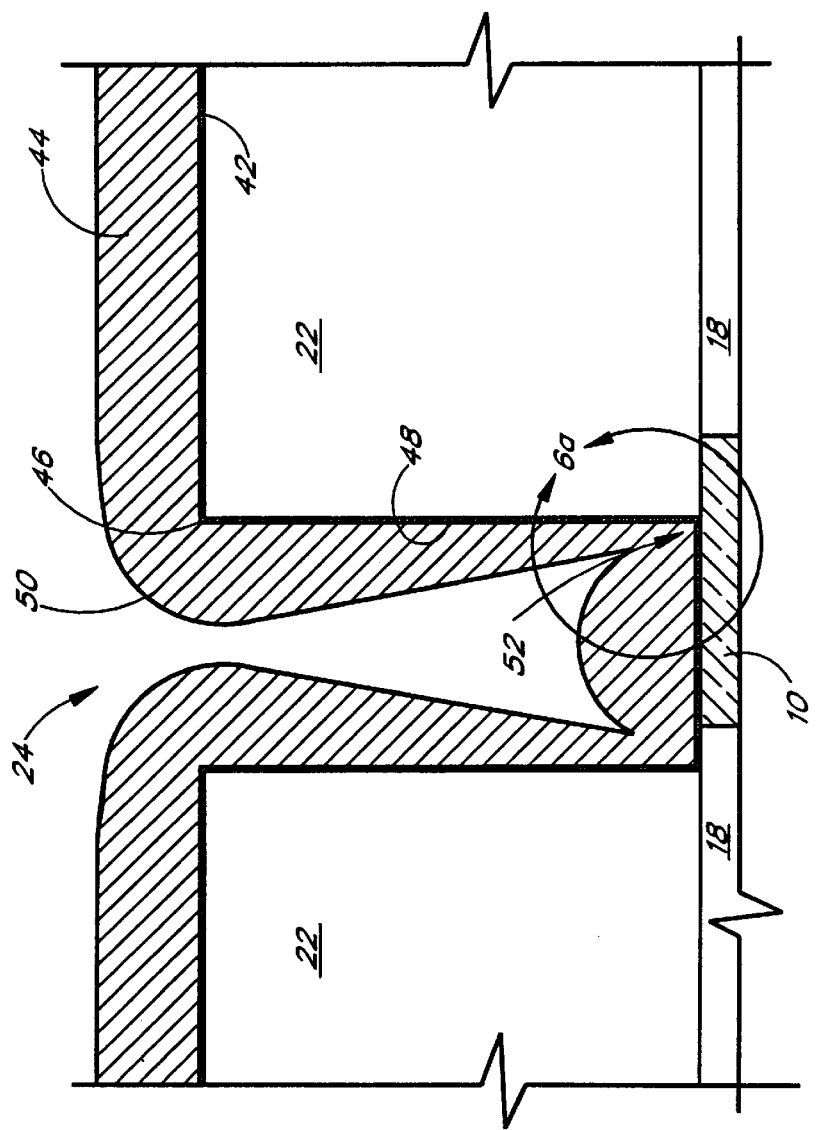

Referring now to FIG. 6, a metal layer 44 is next deposited into the container 24 superjacent the polysilicon layer 42. The metal 44 should form a stable silicide when reacted with silicon. Preferably, the metal 44 comprises a refractory metal, such as titanium (Ti), tungsten (W), cobalt (Co) or molybdenum (Mo), or a noble metal such as platinum (Pt) or nickel (Ni). The metal layer 44 of the preferred embodiment comprises sputtered titanium, which is known to demonstrate extremely low resistivity. Titanium silicide may have resistivity between 13 $\mu\Omega$-cm and 25 $\mu\Omega$-cm (as compared to 3,000 $\Omega$-cm for doped polysilicon). Sufficient titanium should be deposited to completely consume the underlying polysilicon layer 42 during the subsequent silicidation reaction. Thus, the thickness of the preferred metal layer 44 should be at least about 200 Å over the interior surface of the container 24 in order to react with 100 Å of silicon, in accordance with the preferred embodiment.

Since the preferred metal layer 44 is formed by sputter deposition, sputtered metal builds quickly over an upper corner 46 of the container 24. The naturally poor step coverage from sputter deposition is compounded by a shadow effect at a vertical sidewall 48. The faster deposition of metal on the upper corner 46 creates an annular bulge 50 into the mouth of the container 24, sheltering the lower portions and thus continually slowing the deposition rate in a lower corner 52 of the container 24. This phenomenon is especially acute for the high aspect ratio (greater than 1.0) of the preferred container 24. FIG. 6a shows an enlarged view of the tapered metal coverage in the lower corner 52. Accordingly, about 2,000 Å of titanium should be deposited in order to produce a thickness of at least about 200 Å within the lower corner 52 of the preferred container 24. It will be understood that diffusion during a later silicide formation step may cause a desirable redistribution of the reactant silicon and metal atoms, such that metal thicknesses of even less than 200 Å may be acceptable.

This minimal deposition is not critical, however, as there is no strict upper limit to the thickness of the metal layer 44. With continued metal deposition, the metal may eventually pinch off at the container mouth, creating a void or keyhole within the container. Although such formations are ordinarily troublesome in integrated circuit fabrication, the preferred embodiment employs a later selective etch to remove excess metal. The selective etch will be discussed in more detail below. To avoid wasteful deposition of metal which is to be subsequently removed, the metal layer 44 should preferably be deposited to a thickness between about 1,000 Å and 10,000 Å, more preferably between about 1,000 Å and 5,000 Å, and most preferably about 2,000 Å.

Figure 7A:
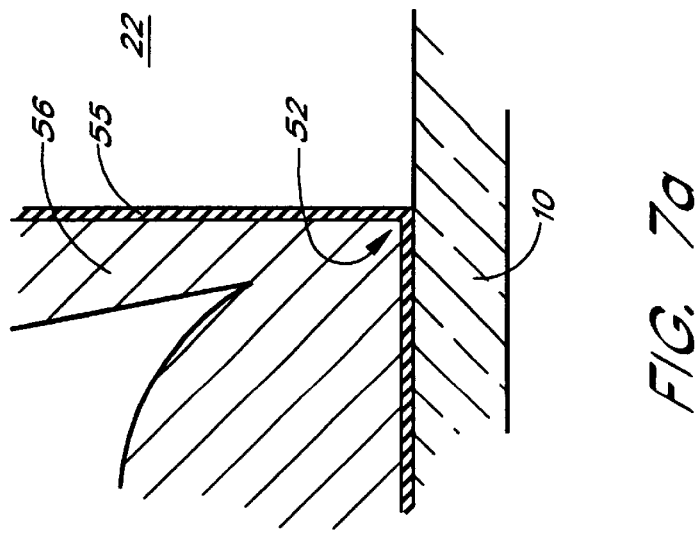
Figure 7:
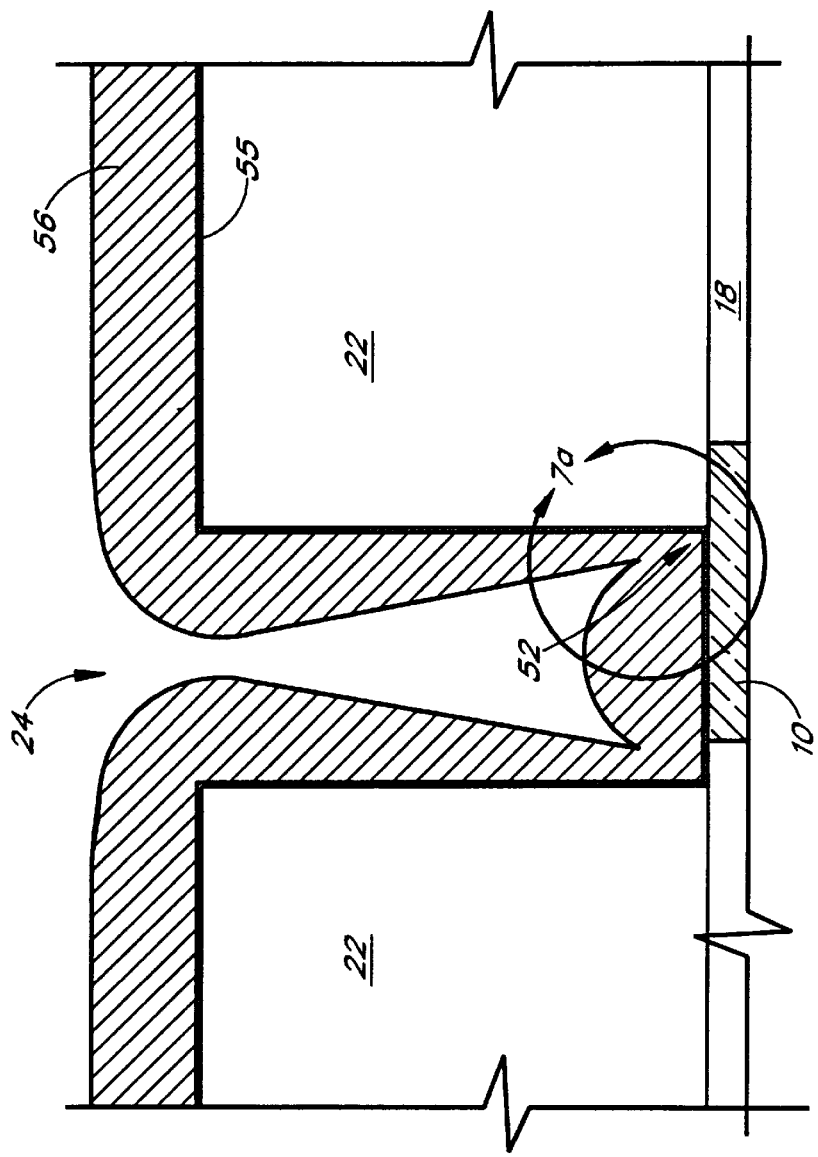

Referring now to FIG. 7, a silicidation step is next performed. For the preferred embodiment, silicidation may be accomplished by sintering or annealing the metal layer 44 and polysilicon layer 42 (FIG. 6) at a temperature between about 400° C. and 1,000° C., more preferably between about 600° C. and 700° C., most preferably about 650° C. Silicidation should most preferably be performed until all of the original polysilicon layer 42 has been consumed and converted into silicide. This anneal may comprise a rapid thermal anneal, performed for between about 5 seconds and 60 seconds, most preferably for about 10 seconds. The silicidation should be performed in an anaerobic environment, such as nitrogen gas or $NH_3$, to minimize contamination of the silicide layer with oxides.

As a result of the silicidation, the polysilicon layer 42 (FIG. 6) is at least substantially converted into a stable silicide layer 55, comprising titanium silicide ($TiSi_x$, where x approaches 2) for the preferred embodiment. FIG. 7a illustrates a close-up view of the container's lower corner 52 following the silicidation. Although illustrated as a complete conversion of the polysilicon 42 (FIG. 6) into silicide 55 (FIG. 7), it will be understood that, depending upon the chosen temperature and duration of the silicidation step, an incomplete conversion may also accomplish objects of the preferred embodiment. In such a case, a silicide layer may overlie any remaining polysilicon. The composite polysilicon/silicide layer is often referred to as a "polycide" layer. Regardless of the extent of silicidation, a thick layer of unreacted metal 56 remains over the silicide 55 due to deliberate deposition of excess metal in the previous step. An additional, very thin layer of metal nitride (not shown) may also form over the unreacted metal 56 as a byproduct of silicidation conducted in a nitrogen ambient. For the preferred embodiment, this nitride would comprise TiN.

Figure 8:
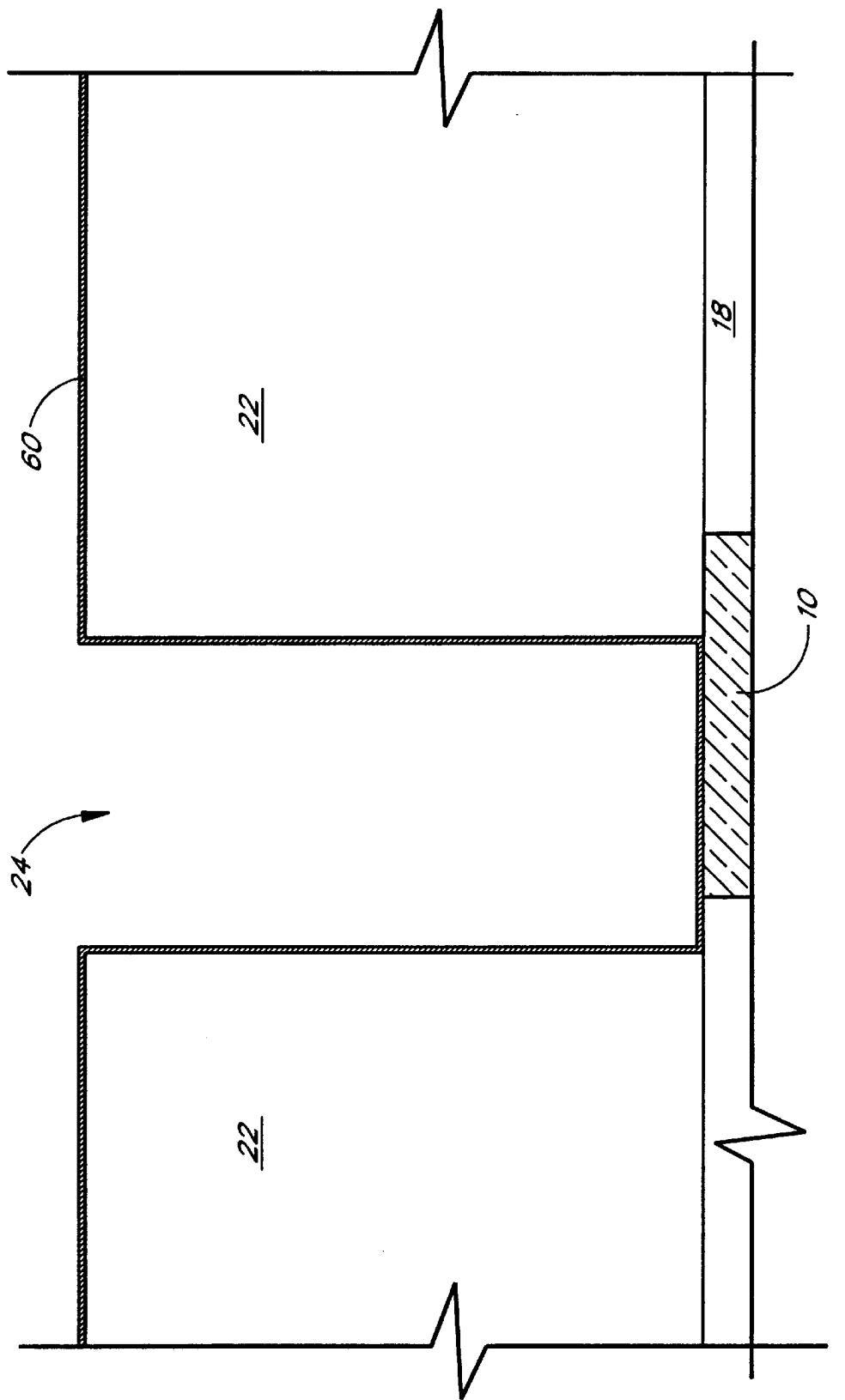

Referring now to FIG. 8, a selective etch is next performed to remove the unreacted metal layer 56 shown in FIG. 7. The selective removal may be accomplished by a conventional wet metal etch or cleaning step. For example, a 1:10 solution of hydrogen peroxide ($H_2O_2$) and sulfuric acid ($H_2SO_4$), known as HH, may be used in this step. The silicon-rich and stable silicide layer 55, preferably $TiSi_x$ and predominantly $TiSi_2$, remains relatively unharmed by the etch. Any metal nitride byproduct may also be removed, along with the excess metal, in this metal etch step. A second anneal may be performed after the wet etch, in order to lower the resistance of the silicide layer 55 (FIG. 7), thus resulting in a thin, highly conductive silicide substrate 60. This anneal, which may be performed at about 800° C. for about 20 seconds, converts titanium silicide from the C49 phase to the C54 phase. It will be understood, however, that alternative silicide materials may not require this second anneal step.

Figure 3:
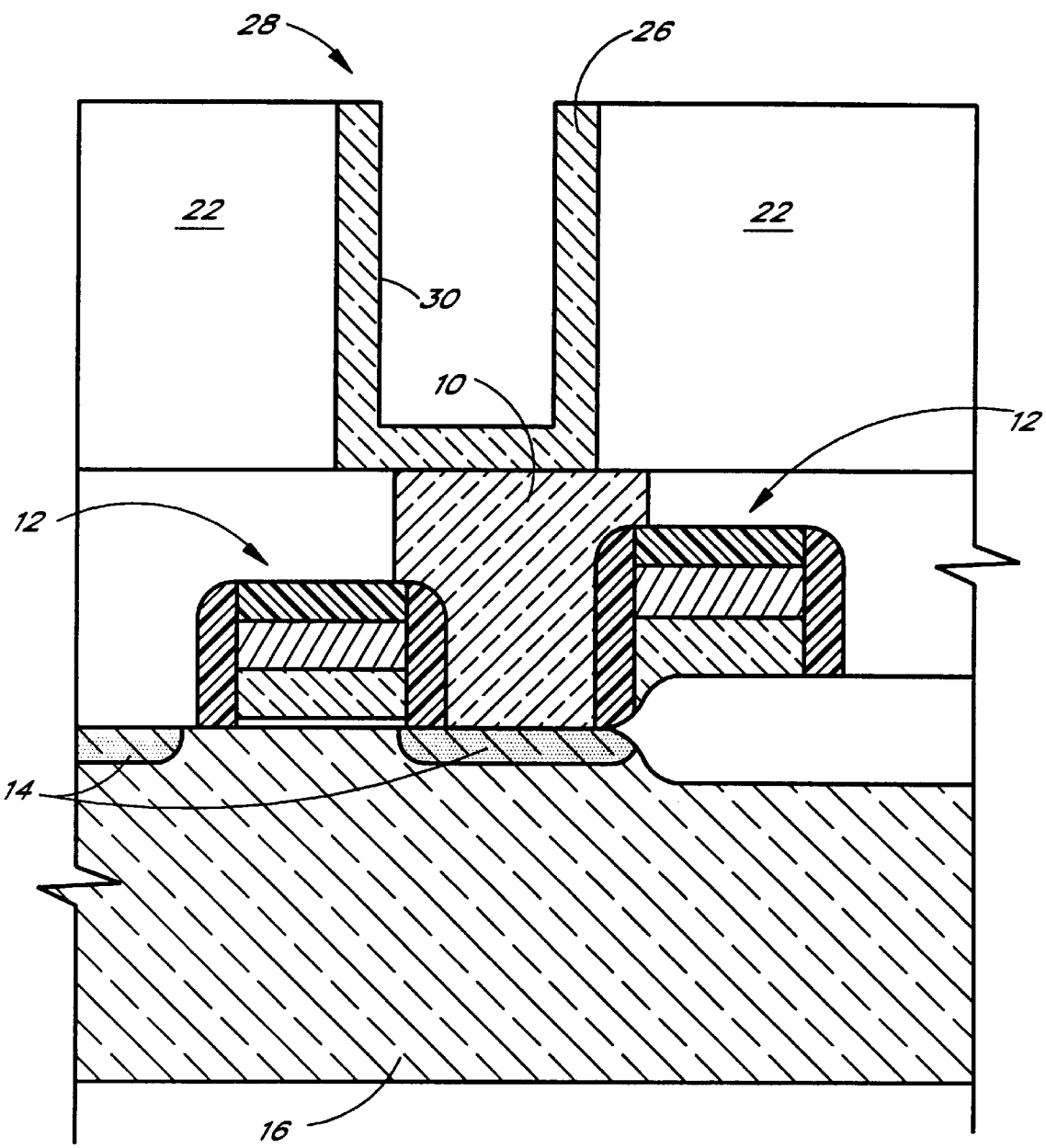

An extremely thin conductive substrate 60 is thus formed within the container 24. Although the preferred substrate 60 is only 100 Å thick and no doping is required, it will demonstrate overall access resistance much lower than a doped polysilicon layer of 500 Å. The present invention may thus provide a conductive lining for high aspect ratio containers, having conductivity comparable to metals and conformality comparable to polysilicon layers. At this point, a planarization step may be performed to remove horizontal portions of this layer, similar to prior art FIG. 3, to produce a highly conductive bottom electrode container without the need for doping. It will be understood by those having skill in this art that the silicide substrate 60 may be produced to any desired thickness by choosing the thickness of the polysilicon layer 42 (FIG. 5) deposited within the container 24, and adjusting exposure to the silicidation anneal accordingly.

However, the present invention has particular utility in conjunction with additional microstructures over the conductive substrate 60. For this reason the substrate 60 of the illustrated embodiment is produced as thin as possible while maintaining adequately low access resistance. This leaves more interior volume within the cell (container) for microstructures than prior art polysilicon substrates of similar conductivity. Thus, microstructures, such as HSG silicon layers, may provide greater surface area for the bottom electrode without crowding the cell interior and causing short circuits across the electrode. Accordingly, the conductive substrate 60 of the preferred embodiment serves as the substrate for an HSG silicon layer.

The HSG silicon may be formed by a number of different methods, including gas phase nucleation. An extremely thin layer of oxide, for example, may serve as a seed layer for HSG growth to follow. Native oxide is allowed to grow over the preferred silicide substrate. Polysilicon may then be deposited by low pressure chemical vapor deposition (LPCVD), and silicon grains grow preferentially about nucleation sites provided by the native oxide. Nucleation sites may also be provided by the deposition of dispersed particles as disclosed by U.S. Pat. No. 5,102,823, issued to Tuttle, the disclosure of which is hereby incorporated by reference. In either case, during the initial stages of polysilicon deposition, the presence of these nucleation sites causes the formation of polysilicon nodules. During later stages of deposition, polysilicon will continue to coat the previously created nodules, resulting in stable, hemispherical polysilicon grains.

Figure 9:
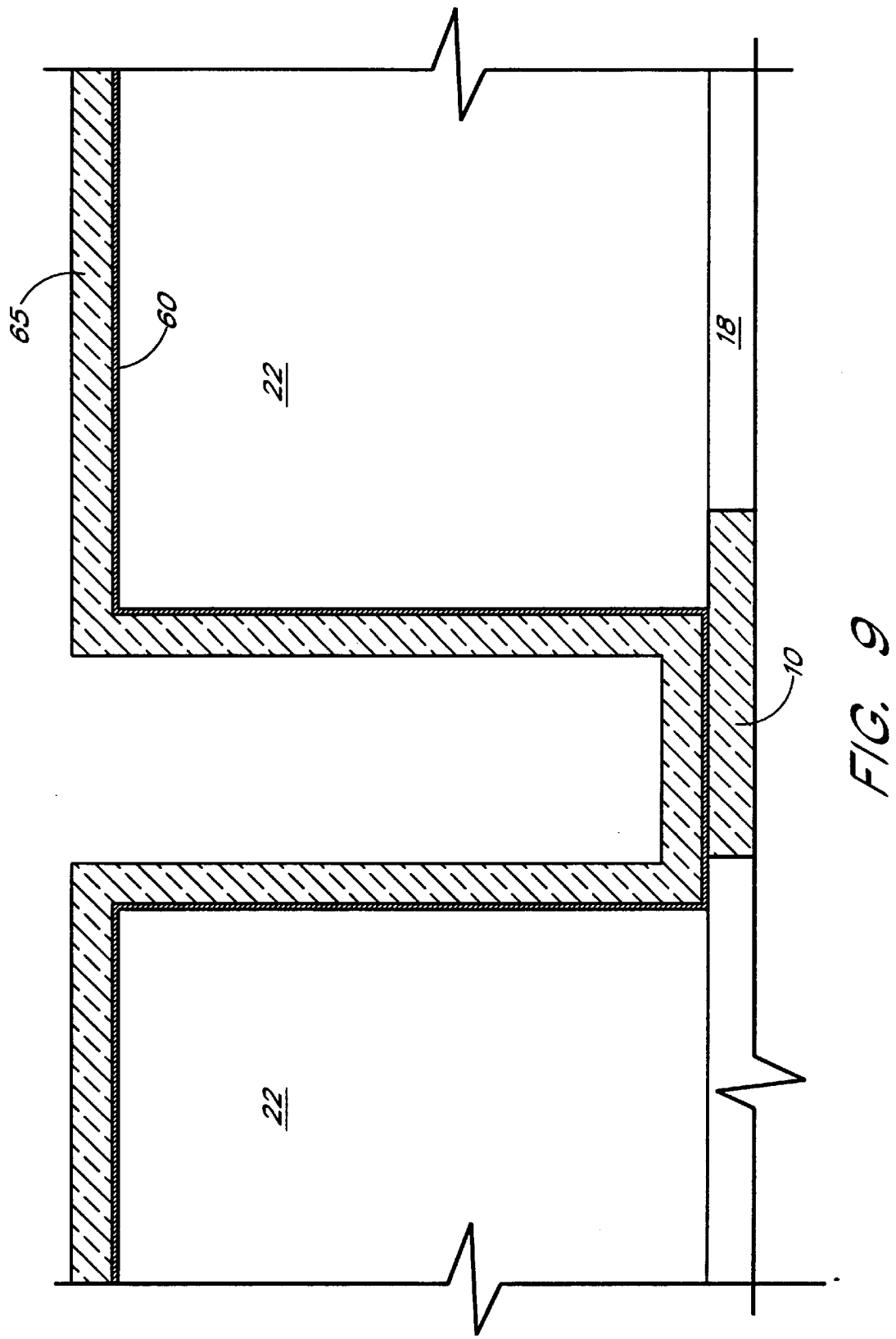

For the preferred embodiment, however, HSG silicon is formed by a surface seeding method. As shown in FIG. 9, a silicon layer 65, preferably comprising amorphous silicon, is deposited over the silicide substrate 60. The structure is then subjected to a vacuum anneal within critical temperature and pressure ranges, inducing thermal nucleation, or microcrystal formation, at the layer's surface. Thermal energy during the anneal brings about a redistribution of silicon atoms in the amorphous silicon layer 64 by causing migration of silicon atoms which are captured by the growing crystals. Hemispherical grains thus grow about these surface nucleation sites. U.S. Pat. No. 5,407,534, issued to Thakur and assigned to the assignee of the present invention, discloses a similar texturizing vacuum anneal wherein a fluorine-based gas (e.g., $NF_3$, $CF_4$, or $C_2F_6Cl_2$), diluted with an inert gas (e.g., argon), enhances the redistribution.

Figure 10:
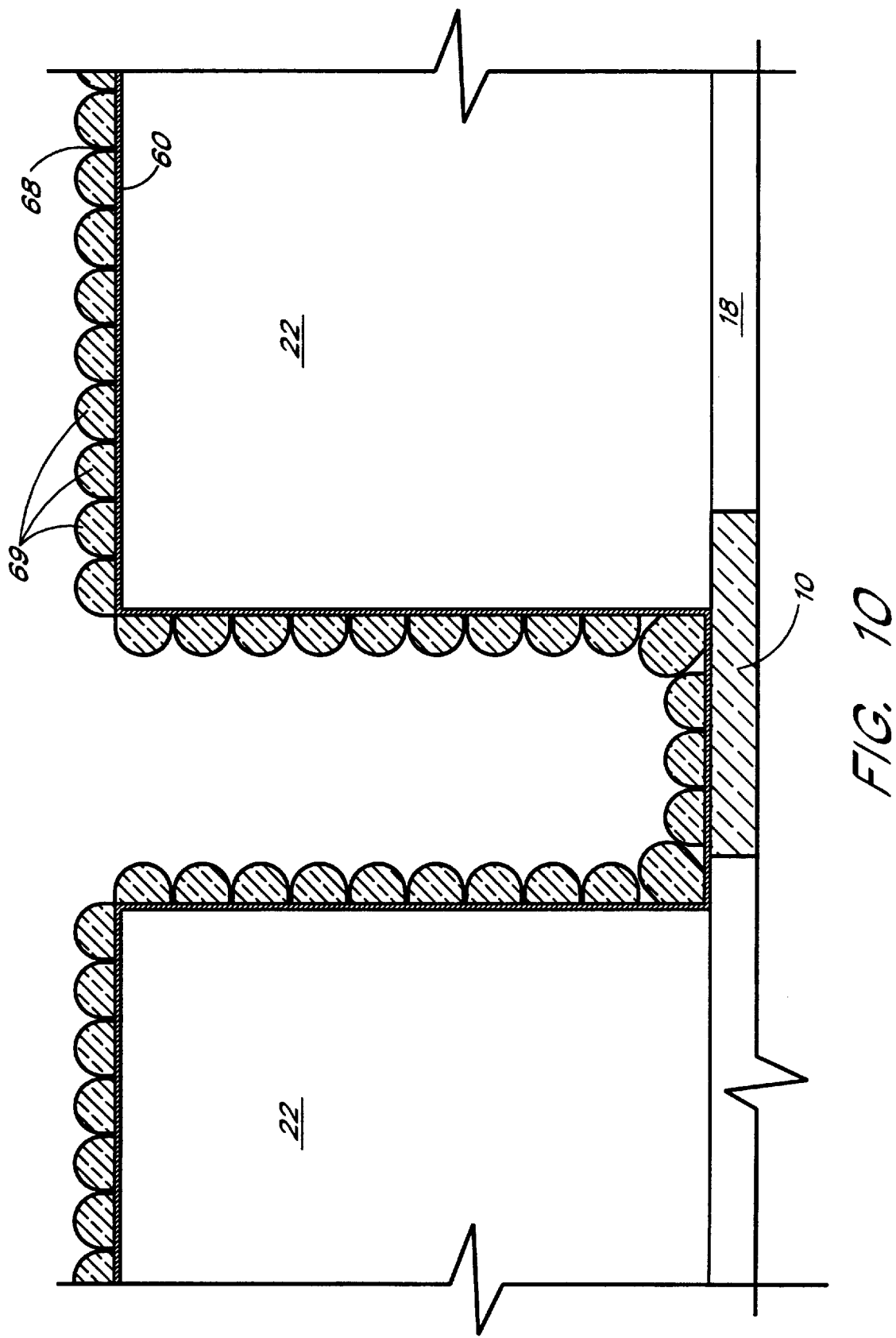

FIG. 10 illustrates an HSG silicon layer 68 created by the preferred process, comprised of high-surface area hemispherical grains or "bumps" 69. The HSG silicon layer 68 may have a thickness or "bump height" between about 300 Å and 1,800 Å, and most preferably about 800 Å for the illustrated embodiment. Together, the HSG silicon 68 and silicide substrate 60 produce a total bottom electrode wall thickness between about 400 Å and 1,900 Å, most preferably about 900 Å, comparable to the in-process prior art bottom electrode illustrated in FIG. 4. Though occupying less total volume of the memory cell than similar prior art bottom electrodes (900 Å electrode walls, as compared to about 1,200 Å for FIG. 4), the preferred embodiment of present invention permits greater bump height for the HSG silicon 68 by utilizing a thinner conductive substrate 60. Accordingly, the preferred bottom electrode will have a greater surface area than prior art electrodes of similar dimensions. Alternatively, cell dimensions may be scaled down for future generation, denser memory arrays while the current bump height (on the order of 600 Å) for HSG silicon is maintained.

Figure 11:
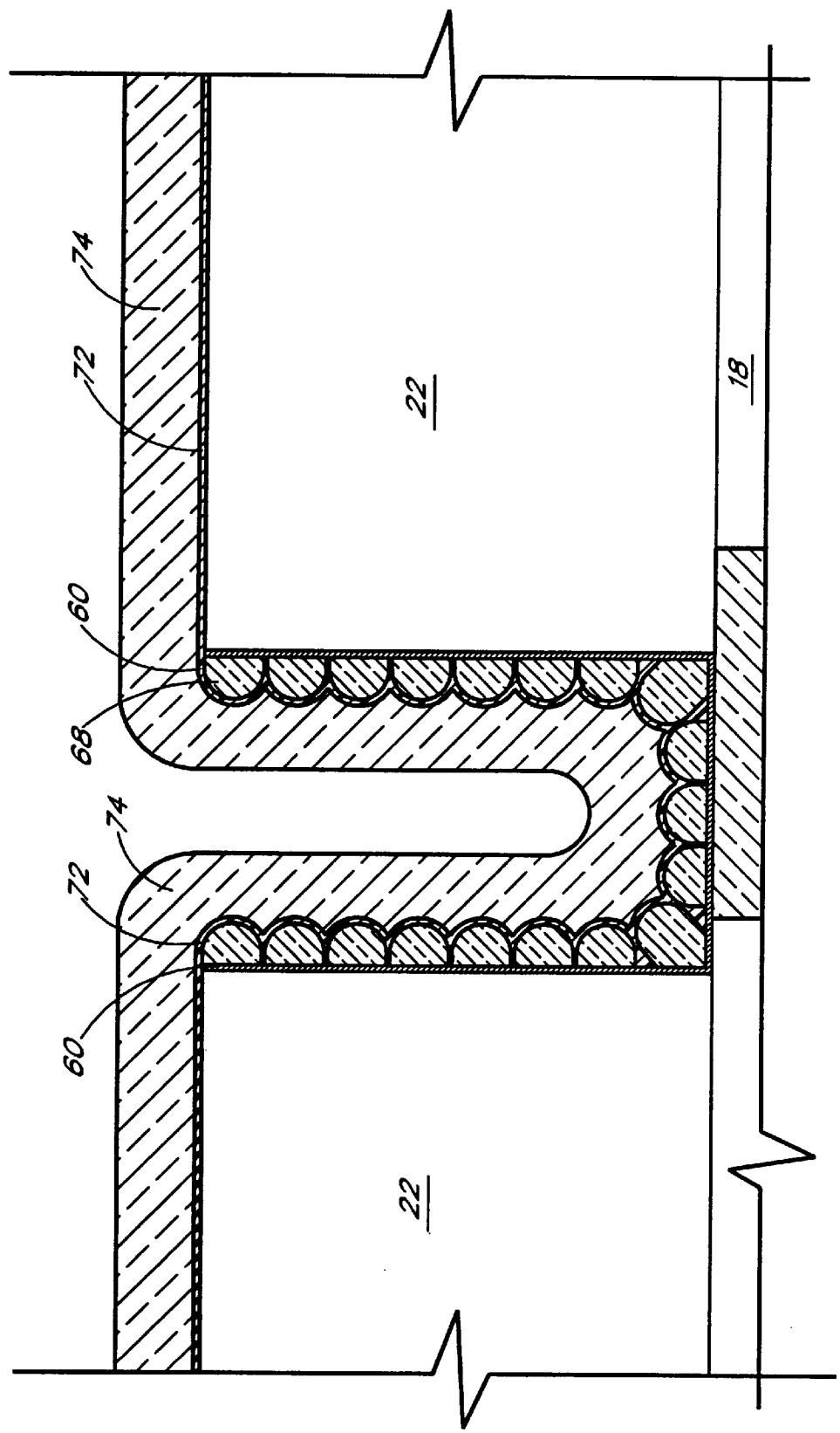

The HSG silicon 68 should be doped for increased conductivity by methods known in the art. As illustrated in FIG. 11, the structure may then be planarized for isolation of memory cells on the array, and a capacitor dielectric 72 conformally deposited over the HSG silicon 68. In accordance with state of the art capacitor fabrication, the dielectric 72 comprises a silicon nitride layer 72 having a thickness between about 50 Å and 80 Å, but it will be understood that the present invention may be utilized in conjunction with any suitable dielectric material.

A conductive top electrode layer 74 is deposited, in turn, over the capacitor dielectric 72. Although the top electrode 74 of the preferred embodiment is illustrated as a polysilicon layer having a thickness of about 1,000 Å, it will be understood by the skilled artisan that the top electrode 74 may also comprise silicide, allowing even further volume for microstructures on the bottom plate surface.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

What is claimed is:

1. A method of fabricating a bottom electrode for a DRAM cell capacitor, the method comprising:
   forming a container in a structural layer overlying a semiconductor substrate;
   substantially conformally lining at least a side and a bottom of the container with a silicide layer; and
   forming a hemispherical grained silicon layer over the silicide layer.

2. The method of claim 1, wherein the container has a width of less than about 9,000 Å and the silicide layer has a thickness of less than about 300 Å.

3. The method of claim 1, wherein the step of lining the container comprises forming a silicide layer of substantially uniform thickness within the container.

4. The method of claim 3, wherein the step of lining the container comprises a chemical vapor deposition (CVD) process.

5. The method of claim 4, wherein the CVD process comprises a low pressure CVD (LPCVD) process.

6. The method of claim 5, wherein the LPCVD process comprises substantially conformally depositing a silicide layer into the container.

7. The method of claim 5, wherein the LPCVD process comprises substantially conformally depositing a silicon layer into the container.

8. The method of claim 7, wherein the step of lining the container further comprises the steps of:
   depositing a metal layer into the container;
   siliciding the silicon layer and the metal layer; and
   selectively etching away an excess metal layer.

9. The method of claim 8, wherein the step of depositing the metal layer into the container comprises a sputter deposition.

10. The method of claim 8, wherein the step of siliciding comprises an anneal conducted between about 400° C. and 1,000° C.

11. The method of claim 8, wherein the metal layer comprises a refractory metal.

12. The method of claim 11, wherein the metal layer comprises titanium.

13. The method of claim 8, wherein the step of selectively etching the excess metal comprises a wet metal etch.

14. The method of claim 13, wherein the metal layer comprises titanium and the wet metal etch comprises etching the excess metal with hydrogen peroxide and sulfuric acid.

15. The method of claim 8, further comprising the step of annealing the silicide layer to produce a low-resistivity silicide substrate.

16. The method of claim 1, wherein the step of forming a hemispherical grained silicon layer comprises:
   depositing an amorphous silicon layer over the silicide layer; and
   vacuum annealing the amorphous silicon layer.

17. The method of claim 16, wherein the hemispherical silicon grained layer is characterized by a bump height of between about 300 Å and 1,800 Å.

18. A method of fabricating a capacitor for an integrated memory cell, the method comprising:
   defining a bottom electrode macrostructural configuration having at least a side and a bottom, and having a limited interior volume;
   forming a silicide layer on at least the side and the bottom of the macrostructural configuration and having a substantially uniform thickness less than about 300 Å;
   forming a microstructural layer over at least an interior surface of the silicide layer;
   forming a cell dielectric conformally over the microstructural layer; and
   depositing a top electrode over the cell dielectric.

19. The method of claim 18, wherein the macrostructural configuration comprises a container shape characterized by a diameter of less than about 9,000 Å and an aspect ratio of at least about 1.0.

20. A method of fabricating a capacitor for an integrated memory cell, the method comprising:
   defining a bottom electrode macrostructural configuration having a limited interior volume;
   substantially conformally lining the macrostructural configuration with a silicon layer;
   substantially conformally lining the silicon layer with a metal-containing conductor;
   forming a microstructural layer over at least an interior surface of the metal-containing conductor;
   forming a cell dielectric conformally over the microstructural layer; and
   depositing a top electrode over the cell dielectric.

21. The method of claim 20, wherein the metal-containing conductor comprises a metal layer.

22. The method of claim 20, wherein the silicon layer and the metal-containing conductor form a conductive composite.

23. The method of claim 22, wherein the conductive composite is of a substantially uniform thickness less than about 300 Å.

24. The method of claim 23, wherein forming the conductive composite comprises forming a silicide layer.

25. A method of fabricating a bottom electrode for a DRAM cell capacitor, the method comprising:
   forming a container in a structural layer overlying a semiconductor substrate;
   forming a silicide layer on at least a side and bottom of the container by a self-aligned silicidation process;
   substantially conformally lining the container with the silicide layer; and
   forming a hemispherical grained silicon layer over the silicide layer.

* * * * *